(12) United States Patent
Kim et al.

(10) Patent No.: US 11,609,494 B2
(45) Date of Patent: *Mar. 21, 2023

(54) SEMICONDUCTOR PHOTORESIST COMPOSITION AND METHOD OF FORMING PATTERNS USING THE COMPOSITION

(71) Applicant: Samsung SDI Co., Ltd., Yongin-si (KR)

(72) Inventors: Jaehyun Kim, Yongin-si (KR); Kyung Soo Moon, Yongin-si (KR); Seungyong Chae, Yongin-si (KR); Ran Namgung, Yongin-si (KR); Seung Han, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/859,682

(22) Filed: Apr. 27, 2020

(65) Prior Publication Data

US 2020/0348591 A1 Nov. 5, 2020

(30) Foreign Application Priority Data

Apr. 30, 2019 (KR) .................. 10-2019-0050856
Dec. 4, 2019 (KR) .................. 10-2019-0160169

(51) Int. Cl.
*G03F 7/004* (2006.01)
*C07F 7/22* (2006.01)
(Continued)

(52) U.S. Cl.
CPC .......... *G03F 7/0042* (2013.01); *C07F 7/2224* (2013.01); *H01L 21/0274* (2013.01); *H01L 21/3081* (2013.01); *G03F 7/20* (2013.01)

(58) Field of Classification Search
CPC .......... G03F 7/0042; G03F 7/20; G03F 7/004; G03F 7/2004; G03F 7/70033; C07F 7/2224; H01L 21/0274; H01L 21/3081
(Continued)

(56) References Cited

U.S. PATENT DOCUMENTS

| 5,061,599 A | 10/1991 | Kudo et al. |
| 6,103,448 A | 8/2000 | Kim et al. |

(Continued)

FOREIGN PATENT DOCUMENTS

| CN | 102269929 A | 12/2011 |
| CN | 108351594 A | 7/2018 |

(Continued)

OTHER PUBLICATIONS

Anderson, Christopher N. et al., "The Sematech Berkeley MET: extending EUV learning down to 16-nm half pitch", Proc. of SPIE 7969, Extreme Ultraviolet (EUV) Lithography II, 79690R, Apr. 5, 2011, 6pp.

(Continued)

*Primary Examiner* — Caleen O Sullivan
(74) *Attorney, Agent, or Firm* — Lewis Roca Rothgerber Christie LLP

(57) ABSTRACT

A semiconductor photoresist composition includes an organometallic compound represented by Chemical Formula 1, an organometallic compound represented by Chemical Formula 2, and a solvent, and a method of forming patterns using the same.

[Chemical Formula 1]

(Continued)

-continued

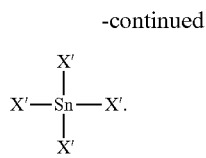

[Chemical Formula 2]

When the semiconductor photoresist composition is irradiated with e.g., extreme ultraviolet light, radical crosslinking between Sn-containing units may occur via Sn—O—Sn bond formation, and a photoresist polymer providing excellent sensitivity, small or reduced line edge roughness, and/or excellent resolution may be formed.

10 Claims, 3 Drawing Sheets

(51) Int. Cl.
  *H01L 21/027* (2006.01)
  *H01L 21/308* (2006.01)
  *G03F 7/20* (2006.01)
(58) Field of Classification Search
  USPC ....................................... 430/270.1; 438/703
  See application file for complete search history.

(56) References Cited

U.S. PATENT DOCUMENTS

| | | | |
|---|---|---|---|
| 6,514,666 | B1 | 2/2003 | Choi et al. |
| 6,607,867 | B1 | 8/2003 | Kim et al. |
| 2002/0072009 | A1 | 6/2002 | Kim et al. |
| 2011/0045406 | A1 | 2/2011 | Keszler et al. |
| 2011/0293888 | A1 | 12/2011 | Stowers et al. |
| 2012/0208127 | A1 | 8/2012 | Hatakeyama |
| 2013/0005150 | A1 | 1/2013 | Ogihara et al. |
| 2013/0224652 | A1 | 8/2013 | Bass et al. |
| 2016/0116839 | A1 | 4/2016 | Meyers et al. |
| 2016/0310944 | A1 | 10/2016 | Nishimura et al. |
| 2017/0052449 | A1 | 2/2017 | Nakagawa et al. |
| 2017/0102612 | A1 | 4/2017 | Meyers et al. |
| 2018/0046086 | A1 | 2/2018 | Wallner et al. |
| 2019/0033713 | A1 | 1/2019 | Kasahara et al. |
| 2019/0337969 | A1 | 11/2019 | Odedra et al. |
| 2019/0384171 | A1 | 12/2019 | Zi et al. |
| 2020/0041896 | A1 | 2/2020 | Moon et al. |
| 2020/0041901 | A1 | 2/2020 | Namgung et al. |
| 2020/0117085 | A1* | 4/2020 | Moon .................. G03F 7/094 |
| 2021/0311387 | A1* | 10/2021 | Woo .................... G03F 7/0042 |
| 2021/0356861 | A1* | 11/2021 | Han .................... H01L 21/0274 |

FOREIGN PATENT DOCUMENTS

| | | |
|---|---|---|
| JP | H8-260159 A | 10/1996 |
| JP | 3990146 B2 | 10/2007 |
| JP | 2009-229593 A | 10/2009 |
| JP | 4831324 B2 | 12/2011 |
| JP | 5178858 B2 | 4/2013 |
| JP | 5650086 B2 | 1/2015 |
| JP | 5708521 B2 | 4/2015 |
| JP | 2017-207532 A | 11/2017 |
| JP | 2018-502173 A | 1/2018 |
| JP | 2018-017780 A | 2/2018 |
| JP | 2018-041099 A | 3/2018 |
| JP | 2019-500490 A | 1/2019 |
| JP | 2020-021071 A | 2/2020 |
| KR | 10-0269513 B1 | 10/2000 |
| KR | 2002-0041759 A | 6/2002 |
| KR | 10-0398312 B1 | 9/2003 |
| KR | 10-0386719 B1 | 5/2004 |
| KR | 10-2014-0121826 A | 10/2014 |
| KR | 10-2017-0022945 A | 3/2017 |
| KR | 10-2017-0132726 A | 12/2017 |
| KR | 10-2020-0005370 A | 1/2020 |
| KR | 10-2020-0018080 A | 2/2020 |
| TW | 201920214 A | 6/2019 |
| TW | 201924927 A | 7/2019 |
| TW | 202007691 A | 2/2020 |
| TW | I684068 B | 2/2020 |
| WO | WO 2016/140057 A1 | 9/2016 |
| WO | WO 2017-169440 A1 | 10/2017 |
| WO | WO 2018/043506 A1 | 3/2018 |
| WO | WO 2018/168221 A1 | 9/2018 |
| WO | WO 2018-179704 A1 | 10/2018 |

OTHER PUBLICATIONS

Okamoto, Hiroshi et al., "Peroxypolytungstic acids: A new inorganic resist material", Applied Physics Letters, Aug. 4, 1986, 49 (5), pp. 298-300.

Stowers, Jason K. et al., "Directly patterned inorganic hardmaskfor EUV lithography,", Proc. of SPIE, vol. 7969, Extreme Ultraviolet (EUV) Lithography II, 796915, 2011, 11pp.

JPO Office action dated May 25, 2021 issued in corresponding JP Application No. 2020-080534, 4 pages.

TW Office Action and Search Report dated Nov. 16, 2021 in corresponding Taiwanese Patent Application No. 110116951, 7 pages.

Taiwanese Office Action dated Nov. 8, 2021, in Taiwanese Patent Application No. 109114182 and accompanying Search Report (6 pages).

Japanese Office Action for JP Application No. 2021-056503 dated Mar. 29, 2022, 3 pages.

Taiwanese Office Action for TW Application No. 110111615 dated Apr. 29, 2022, 5 pages.

Notice of Reason for Rejection for JP Application No. 2021-078454 dated Jun. 7, 2022, 3 pages.

U.S. Restriction Requirement dated Jan. 3, 2023, issued in U.S. Appl. No. 17/306,820 (6 pages).

\* cited by examiner

【FIG. 1】
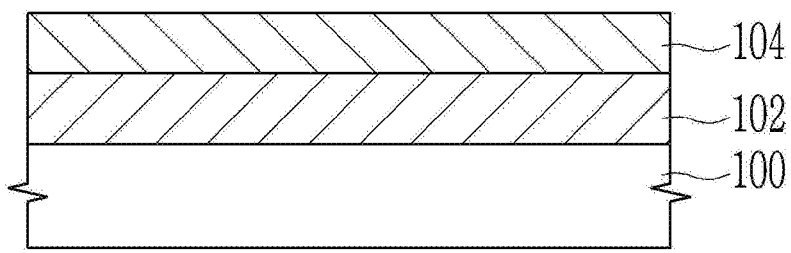
【FIG. 2】
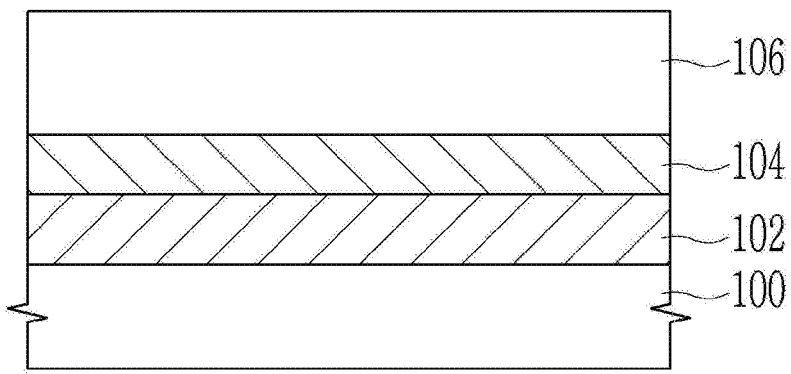

[FIG. 3]
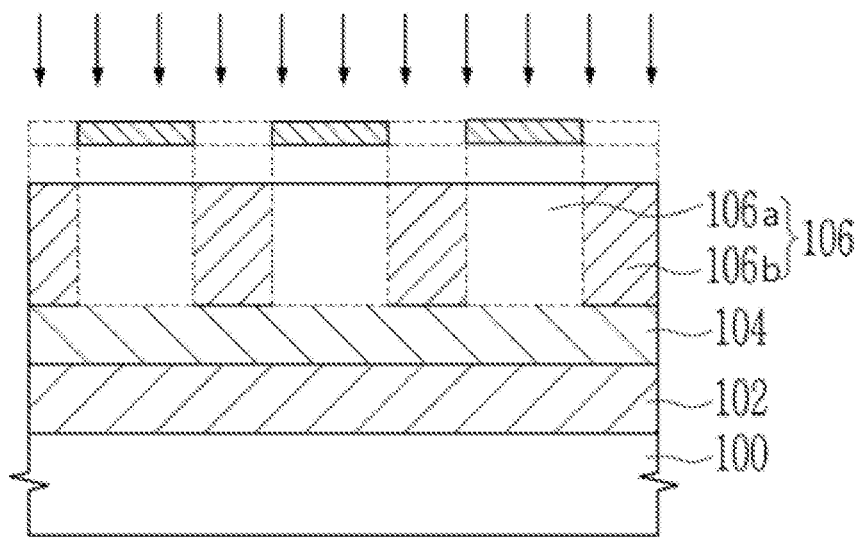
[FIG. 4]
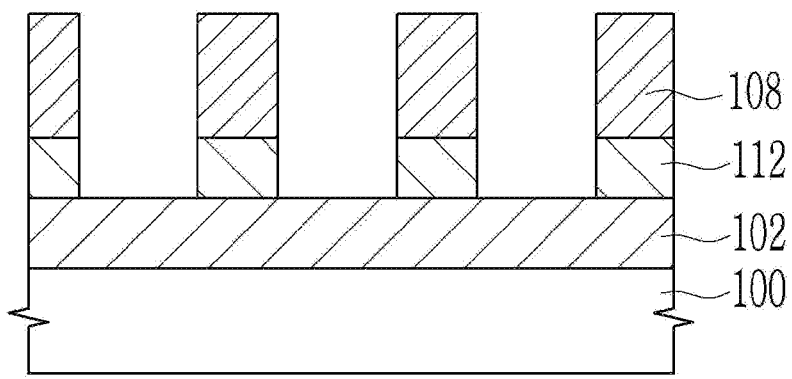

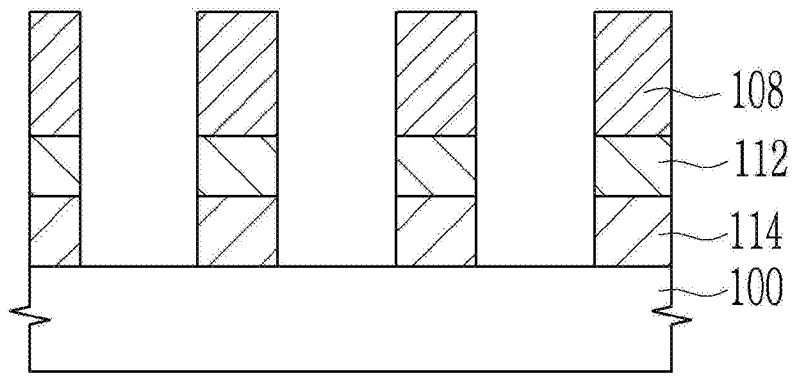
【FIG. 5】

SEMICONDUCTOR PHOTORESIST COMPOSITION AND METHOD OF FORMING PATTERNS USING THE COMPOSITION

CROSS-REFERENCE TO RELATED APPLICATIONS

This application claims priority to and the benefit of Korean Patent Application No. 10-2019-0050856, filed in the Korean Intellectual Property Office on Apr. 30, 2019, and Korean Patent Application No. 10-2019-0160169, filed in the Korean Intellectual Property Office on Dec. 4, 2019, the entire content of each of which is incorporated herein by reference.

BACKGROUND DISCLOSURE

1. Field Disclosure

One or more aspects of embodiments of the present disclosure relate to a semiconductor photoresist composition and a method of forming patterns using the same.

2. Description of the Related Art

EUV (extreme ultraviolet) lithography is an important technology for manufacturing next generation semiconductor devices. EUV lithography is a pattern-forming technology using an EUV ray having a wavelength of about 13.5 nm as an exposure light source. When EUV lithography is utilized, an extremely fine pattern (e.g., having a spatial resolution of less than or equal to about 20 nm) may be formed in an exposure process during a manufacture of a semiconductor device.

Extreme ultraviolet (EUV) lithography may be facilitated by development of compatible photoresists that can be performed at a spatial resolution of less than or equal to about 16 nm. Current efforts are focused on improving the specifications (such as resolution, photospeed, and feature roughness (also referred to as line edge roughness (LER)) of chemically amplified (CA) photoresists for next generation devices.

Intrinsic image blurring due to an acid catalyzed reaction in such polymer-type photoresists limits the resolution of small features, which has been well known in electron beam (e-beam) lithography for a long time. Chemically amplified (CA) photoresists are designed for high sensitivity, but because their typical elemental makeups reduce light absorbance of the photoresists at a wavelength of about 13.5 nm and thus decrease their sensitivity, chemically amplified (CA) photoresists may have more difficulties (e.g., exposure defects) under an EUV exposure.

In addition, the CA photoresists may have difficulties in the small feature sizes (e.g., may produce defects in high resolution features) due to roughness issues, because the line edge roughness (LER) of the CA photoresists has been experimentally shown to increase as the photospeed is decreased, partially due to acid-catalyzed processes. Accordingly, a novel high performance photoresist is desired by the semiconductor industry because of these defects and problems of CA photoresists.

Inorganic photoresists based on peroxopolyacids of tungsten mixed with tungsten, niobium, titanium, and/or tantalum have been reported as radiation sensitive materials for patterning. These materials are effective with far ultraviolet (UV) (deep UV), X-ray, and electron beam sources for patterning large pitches for a bilayer configuration. More recently, cationic hafnium metal oxide sulfate (HfSOx) materials along with a peroxo complexing agent have been used to image a 15 nm half-pitch (HP) through projection EUV exposure, obtaining impressive performance. This system exhibits the highest performance of a non-CA photoresist and has a practicable photospeed near to that required for (e.g., suitable for) an EUV photoresist. However, the hafnium metal oxide sulfate materials with peroxo complexing agent have a few practical drawbacks. First, these materials are coated in a mixture of corrosive sulfuric acid/hydrogen peroxide and have insufficient shelf-life stability. Second, a structural change thereof for performance improvement as a composite mixture is not easy. Third, development should be performed in a TMAH (tetramethylammonium hydroxide) solution at an extremely high concentration of about 25 wt % and/or the like.

In order to overcome the aforementioned drawbacks of the chemically amplified (CA) photosensitive composition, an inorganic photosensitive composition has been developed. The inorganic photosensitive composition is mainly used for negative tone patterning and is resistant to removal by a developer using chemical modification because it has a nonchemical amplification mechanism. The inorganic composition contains an inorganic element having a higher EUV absorption rate than hydrocarbons and may thus secure sensitivity through the nonchemical amplification mechanism, and in addition, may be less sensitive to stochastic effects and may thus have low line edge roughness and a smaller number of defects.

In recent years, active research has been conducted on molecules containing tin, which have excellent absorption of extreme ultraviolet rays. In an organic tin polymer, an alkyl ligand may be dissociated by light absorption or secondary electrons produced from light absorption, and may subsequently cross-link with adjacent chains through an oxo bond and thus enable negative tone patterning, which may not be removed by an organic developing solution. This organic tin polymer exhibits greatly improved sensitivity and maintains a high resolution and line edge roughness, but the patterning characteristics should be additionally improved for commercial availability.

SUMMARY DISCLOSURE

One or more aspects of embodiments of the present disclosure are directed toward a semiconductor photoresist composition having improved etch resistance, sensitivity, resolution, and/or pattern-forming capability.

One or more aspects of embodiments of the present disclosure are directed toward a method of forming patterns using the semiconductor photoresist composition.

One or more example embodiments of the present disclosure provide a semiconductor photoresist composition including an organometallic compound represented by Chemical Formula 1, an organometallic compound represented by Chemical Formula 2, and a solvent.

[Chemical Formula 1]

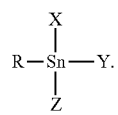

In Chemical Formula 1,

R is a substituted or unsubstituted C1 to C20 alkyl group, a substituted or unsubstituted C3 to C20 cycloalkyl group, a substituted or unsubstituted C2 to C20 aliphatic unsaturated organic group including at least one double bond or triple bond, a substituted or unsubstituted C6 to C30 aryl group, an ethylene oxide group, a propylene oxide group, or any combination thereof, X, Y, and Z are each independently —OR$^1$ or —OC(=O)R$^2$, R$^1$ is a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or any combination thereof, and R$^2$ is hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or any combination thereof.

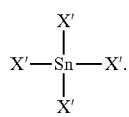

[Chemical Formula 2]

In Chemical Formula 2,

X' is —OR$^3$ or —OC(=O)R$^4$,

R$^3$ is a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or any combination thereof, and R$^4$ is hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or any combination thereof.

In some embodiments, R may be a substituted or unsubstituted C1 to C8 alkyl group, a substituted or unsubstituted C3 to C8 cycloalkyl group, a substituted or unsubstituted C2 to C8 aliphatic unsaturated organic group including at least one double bond or triple bond, a substituted or unsubstituted C6 to C20 aryl group, an ethylene oxide group, a propylene oxide group, or any combination thereof, and In some embodiments, R$^1$ and R$^3$ may each independently be a substituted or unsubstituted C1 to C8 alkyl group, a substituted or unsubstituted C3 to C8 cycloalkyl group, a substituted or unsubstituted C2 to C8 alkenyl group, a substituted or unsubstituted C2 to C8 alkynyl group, a substituted or unsubstituted C6 to C20 aryl group, or any combination thereof, and In some embodiments, R$^2$ and R$^4$ may each independently be hydrogen, a substituted or unsubstituted C1 to C8 alkyl group, a substituted or unsubstituted C3 to C8 cycloalkyl group, a substituted or unsubstituted C2 to C8 alkenyl group, a substituted or unsubstituted C2 to C8 alkynyl group, a substituted or unsubstituted C6 to C20 aryl group, or a combination thereof.

In some embodiments, R may be a methyl group, an ethyl group, a propyl group, a butyl group, an isopropyl group, a tert-butyl group, a 2,2-dimethylpropyl group, a cyclopropyl group, a cyclobutyl group, a cyclopentyl group, a cyclohexyl group, an ethenyl group, a propenyl group, a butenyl group, an ethynyl group, a propynyl group, a butynyl group, a phenyl group, a tolyl group, a xylene group, a benzyl group, an ethylene oxide group, a propylene oxide group, or any combination thereof, In some embodiments, R$^1$ and R$^3$ may each independently be a methyl group, an ethyl group, a propyl group, a butyl group, an isopropyl group, a tert-butyl group, a 2,2-dimethylpropyl group, a cyclopropyl group, a cyclobutyl group, a cyclopentyl group, a cyclohexyl group, an ethenyl group, a propenyl group, a butenyl group, an ethynyl group, a propynyl group, a butynyl group, a phenyl group, a tolyl group, a xylene group, a benzyl group, or any combination thereof, and In some embodiments, R$^2$ and R$^4$ may each independently be hydrogen, a methyl group, an ethyl group, a propyl group, a butyl group, an isopropyl group, a tert-butyl group, a 2,2-dimethylpropyl group, a cyclopropyl group, a cyclobutyl group, a cyclopentyl group, a cyclohexyl group, an ethenyl group, a propenyl group, a butenyl group, an ethynyl group, a propynyl group, a butynyl group, a phenyl group, a tolyl group, a xylene group, a benzyl group, or any combination thereof.

In some embodiments, the compound represented by Chemical Formula 1 may be a compound represented by Chemical Formula 3, a compound represented by Chemical Formula 4, a compound represented by Chemical Formula 5, a compound represented by Chemical Formula 6, or any combination thereof:

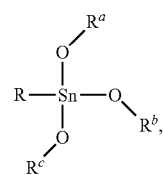

[Chemical Formula 3]

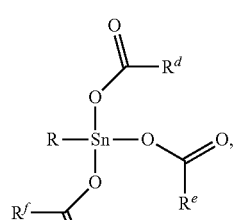

[Chemical Formula 4]

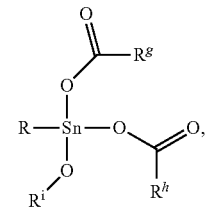

[Chemical Formula 5]

[Chemical Formula 6]

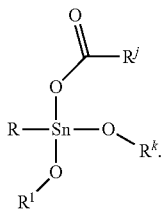

In Chemical Formula 3 to Chemical Formula 6,

R may be the same as defined in Chemical Formula 1, $R^a$, $R^b$, $R^c$, $R^i$, $R^k$, and $R^l$ may each independently be the same as defined for $R^1$ in Chemical Formula 1, and $R^d$, $R^e$, $R^f$, $R^g$, $R^h$, and $R^j$ may each independently be the same as defined for $R^2$ in Chemical Formula 1.

In some embodiments, the semiconductor photoresist composition may include the organometallic compound represented by Chemical Formula 1 and the organometallic compound represented by Chemical Formula 2 in a weight ratio of about 20:1 to about 1:1.

In some embodiments, the semiconductor photoresist composition may include about 0.01 wt % to about 30 wt % of the organometallic compound represented by Chemical Formula 1 and about 0.01 wt % to about 15 wt % of the organometallic compound represented by Chemical Formula 2 based on 100 wt % of the semiconductor photoresist composition.

In some embodiments, the semiconductor photoresist composition may further include an additive selected from a surfactant, a cross-linking agent, a leveling agent, and combinations thereof.

One or more example embodiments of the present disclosure provide a method of forming patterns including: forming an etching-objective layer on a substrate, coating the semiconductor photoresist composition on the etching-objective layer to form a photoresist layer, patterning the photoresist layer to form a photoresist pattern, and etching the etching-objective layer using the photoresist pattern as an etching mask.

In some embodiments, the photoresist pattern may be formed using light in a wavelength of about 5 nm to about 150 nm.

In some embodiments, the method of forming patterns may further include providing a resist underlayer formed between the substrate and the photoresist layer.

In some embodiments, the photoresist pattern may have a width of about 5 nm to about 100 nm.

The semiconductor photoresist composition according to an embodiment may have relatively improved etch resistance, sensitivity, resolution, and/or pattern-forming capability, and may thus provide a photoresist pattern having improved sensitivity and a high aspect ratio without a pattern collapse.

BRIEF DESCRIPTION OF THE DRAWINGS

FIGS. 1 to 5 are cross-sectional views for explaining a method of forming patterns using a semiconductor resist composition according to an embodiment.

DETAILED DESCRIPTION

Hereinafter, example embodiments of the present disclosure will be described in more detail by referring to the accompanying drawings. However, in the description of the present disclosure, descriptions of already known functions or components may be omitted for clarifying the gist of the present disclosure.

In order to more clearly describe the present disclosure, parts that are not related to the description may be omitted, and the same reference numeral will refer to the same or like components throughout the specification. In addition, because the size and the thickness of each component shown in the drawing are optionally represented for convenience of the description, the present disclosure is not limited to the illustration.

In the drawings, the thickness of layers, films, panels, regions, etc., may be exaggerated for clarity. It will be understood that when an element such as a layer, film, region, or substrate is referred to as being "on" another element, it can be directly on the other element, or intervening elements may also be present.

As used herein, the singular forms "a," "an," and "the" are intended to include the plural forms as well, unless the context clearly indicates otherwise. It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

As used herein, expressions such as "at least one of", "one of", and "selected from", when preceding a list of elements, modify the entire list of elements and do not modify the individual elements of the list.

As used herein, the term "and/or" includes any and all combinations of one or more of the associated listed items. Further, the use of "may" when describing embodiments of the present disclosure refers to "one or more embodiments of the present disclosure".

In this disclosure, the term "substituted" refers to replacement of a hydrogen atom with deuterium, a halogen, a hydroxy group, a cyano group, a nitro group, —NRR' (wherein R and R' are each independently hydrogen, a substituted or unsubstituted C1 to C30 saturated or unsaturated aliphatic hydrocarbon group, a substituted or unsubstituted C3 to C30 saturated or unsaturated alicyclic hydrocarbon group, or a substituted or unsubstituted C6 to C30 aromatic hydrocarbon group), —SiRR'R" (wherein R, R', and R" are each independently hydrogen, a substituted or unsubstituted C1 to C30 saturated or unsaturated aliphatic hydrocarbon group, a substituted or unsubstituted C3 to C30 saturated or unsaturated alicyclic hydrocarbon group, or a substituted or unsubstituted C6 to C30 aromatic hydrocarbon group), a C1 to C30 alkyl group, a C1 to C10 haloalkyl group, a C1 to C10 alkylsilyl group, a C3 to C30 cycloalkyl group, a C6 to C30 aryl group, a C1 to C20 alkoxy group, or a combination thereof. The term "unsubstituted" refers to non-replacement of a hydrogen atom by another substituent such that the hydrogen atom remains intact.

As used herein, when a definition is not otherwise provided, the term "hetero" refers to inclusion of 1 to 3 heteroatoms selected from nitrogen (N), oxygen (O), and sulfur (S). The term "alkyl group" may refer to a "saturated alkyl group" that does not include any double or triple bonds.

The alkyl group may be a C1 to C8 alkyl group. For example, the alkyl group may be a C1 to C7 alkyl group, a C1 to C6 alkyl group, a C1 to C5 alkyl group, or a C1 to C4 alkyl group. For example, the C1 to C4 alkyl group may be a methyl group, an ethyl group, a propyl group, an isopropyl group, an n-butyl group, an isobutyl group, a sec-butyl group, a tert-butyl group, or a 2,2-dimethylpropyl group.

As used herein, when a definition is not otherwise provided, the term "cycloalkyl group" refers to a monovalent cyclic aliphatic hydrocarbon group.

The cycloalkyl group may be a C3 to C8 cycloalkyl group, for example, a C3 to C7 cycloalkyl group, a C3 to C6 cycloalkyl group, a C3 to C5 cycloalkyl group, or a C3 to C4 cycloalkyl group. For example, the cycloalkyl group may be a cyclopropyl group, a cyclobutyl group, a cyclopentyl group, or a cyclohexyl group, but is not limited thereto.

As used herein, the term "aliphatic unsaturated organic group" refers to a hydrocarbon group including one or more carbon-carbon double bonds and/or triple bonds.

The aliphatic unsaturated organic group may be a C2 to C8 aliphatic unsaturated organic group. For example, the aliphatic unsaturated organic group may be a C2 to C7 aliphatic unsaturated organic group, a C2 to C6 aliphatic unsaturated organic group, a C2 to C5 aliphatic unsaturated organic group, or a C2 to C4 aliphatic unsaturated organic group. For example, the C2 to C4 aliphatic unsaturated organic group may be a vinyl group, an ethynyl group, an allyl group, a 1-propenyl group, a 1-methyl-1-propenyl group, a 2-propenyl group, a 2-methyl-2-propenyl group, a 1-propynyl group, a 1-methyl-1 propynyl group, a 2-propynyl group, a 2-methyl-2-propynyl group, a 1-butenyl group, a 2-butenyl group, a 3-butenyl group, a 1-butynyl group, a 2-butynyl group, or a 3-butynyl group.

As used herein, the term "aryl group" refers to a cyclic substituent in which all of the ring-forming atoms have mutually conjugated p-orbitals normal to the plane of the ring, and the aryl group may be a monocyclic functional group or a fused ring polycyclic functional group (i.e., may include two or more rings sharing adjacent pairs of carbon atoms).

As used herein, unless otherwise defined, the term "alkenyl group" refers to a linear or branched aliphatic unsaturated hydrocarbon group including at least one double bond.

As used herein, unless otherwise defined, the term "alkynyl group" refers to a linear or branched aliphatic unsaturated hydrocarbon group including at least one triple bond.

One or more example embodiments of the present disclosure provide a semiconductor photoresist composition according to an embodiment as hereinafter described.

A semiconductor photoresist composition according to an embodiment of the present disclosure includes organometallic compounds and a solvent, where the organometallic compounds include (e.g., consist of) compounds represented by Chemical Formula 1 and Chemical Formula 2.

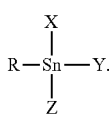

[Chemical Formula 1]

In Chemical Formula 1,

R may be a substituted or unsubstituted C1 to C20 alkyl group, a substituted or unsubstituted C3 to C20 cycloalkyl group, a substituted or unsubstituted C2 to C20 aliphatic unsaturated organic group including at least one double bond or triple bond, a substituted or unsubstituted C6 to C30 aryl group, an ethylene oxide group, a propylene oxide group, or any combination thereof, X, Y, and Z may each independently be —OR$^1$ or —OC(=O)R$^2$, R$^1$ may be a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or any combination thereof, and R$^2$ may be hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or any combination thereof.

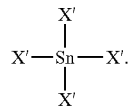

[Chemical Formula 2]

In Chemical Formula 2,

X' may be —OR$^3$ or —OC(=O)R$^4$,

R$^3$ may be a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or any combination thereof, and R$^4$ may be hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or any combination thereof.

The organic tin copolymer including the organometallic compounds represented by Chemical Formulae 1 and 2 may be prepared by copolymerizing an organometallic compound represented by Chemical Formula 1 (which has a tin atom substituted with one R group and three —OR$^1$'s or —OC(=O)R$^2$'s) and an organometallic compound represented by Chemical Formula 2 (which has a tin atom substituted with four —OR$^1$'s or —OC(=O)R$^2$'s).

The compounds represented by Chemical Formulae 1 and 2 are organic tin compounds, wherein tin may intensively absorb extreme ultraviolet (EUV) light at 13.5 nm and thus have excellent sensitivity to high energy light, the R group bound to tin (Sn) of Chemical Formula 1 may make the compound photosensitive, and the Sn—R bond may solubilize the organic tin compound in an organic solvent. X, Y, and Z of Chemical Formula 1, —OR$^3$ or —OC(=O)R$^4$, and X' of Chemical Formula 2 may each or collectively determine or affect the solubility of the two compounds in a solvent.

With regard to R of Chemical Formula 1, when the organic tin copolymer having structural units formed through copolymerization of the compounds represented by Chemical Formulae 1 and 2 is exposed to extreme ultraviolet (EUV), the R functional group may be dissociated from the Sn—R bond so that a radical is formed, and this radical (e.g., a Sn. radical) may form an additional —Sn—O—Sn— bond and initiate a condensation polymerization reaction between organic tin copolymers, thereby forming a semiconductor photoresist from the composition according to an embodiment.

In the organometallic compound represented by Chemical Formula 1, the substituent represented by R may be a substituted or unsubstituted C1 to C20 alkyl group, a substituted or unsubstituted C3 to C20 cycloalkyl group, a substituted or unsubstituted C2 to C20 aliphatic unsaturated organic group including at least one double bond or triple bond, a substituted or unsubstituted C6 to C30 aryl group, an ethylene oxide group, a propylene oxide group, or any combination thereof.

The compound represented by Chemical Formula 1 may further include three organic ligands X, Y, and Z, which may each be hydrolyzed to form Sn—O bonds, in addition to the substituent R. In addition, the compound represented by Chemical Formula 2 is hydrolyzed, and thus includes four X' substituents forming a Sn—O bond with a tin atom. X, Y, Z, and X' may each independently be —$OR^1$ or —$OC(=O)R^2$, the organic groups therein may be hydrolyzed through a heat treatment or by a non-heated treatment with an acidic or basic catalyst to thereby form a Sn—O—Sn bond between the organic tin compounds, and accordingly, the organometallic compounds represented by Chemical Formulae 1 and 2 may form the organic tin copolymer.

The semiconductor photoresist composition according to an embodiment of the present disclosure concurrently (e.g., simultaneously) includes the organometallic compound represented by Chemical Formula 1 and the organometallic compound represented by Chemical Formula 2, and thus may exhibit improved sensitivity compared with a semiconductor photoresist composition including an organometallic compound represented by Chemical Formula 1 or 2 alone.

A ratio of the organometallic compounds represented by Chemical Formulae 1 and 2 in the copolymer may be suitably or appropriately controlled to adjust a dissociation degree of a ligand represented by R from the copolymer (e.g., the percentage of R that dissociates from Sn) and thus a cross-linking degree (which occurs through oxo bond formation between the radical generated through the dissociation of the ligand and adjacent chains), and may therefore provide a semiconductor photoresist having excellent sensitivity, small or reduced line edge roughness, and/or an excellent resolution. For example, a semiconductor photoresist having improved sensitivity, line edge roughness, and/or resolution may be provided by (e.g., simultaneously) including both of the organometallic compounds represented by Chemical Formulae 1 and 2.

R may be, for example, a substituted or unsubstituted C1 to C8 alkyl group, a substituted or unsubstituted C3 to C8 cycloalkyl group, a substituted or unsubstituted C2 to C8 aliphatic unsaturated organic group including at least one double bond or triple bond, a substituted or unsubstituted C6 to C20 aryl group, an ethylene oxide group, a propylene oxide group, or any combination thereof, for example, a methyl group, an ethyl group, a propyl group, a butyl group, an isopropyl group, a tert-butyl group, a 2,2-dimethylpropyl group, a cyclopropyl group, a cyclobutyl group, a cyclopentyl group, a cyclohexyl group, an ethenyl group, a propenyl group, a butenyl group, an ethynyl group, a propynyl group, a butynyl group, a phenyl group, a tolyl group, a xylene group, a benzyl group, an ethylene oxide group, a propylene oxide group, or any combination thereof.

$R^1$ and $R^3$ may each independently be, for example, a substituted or unsubstituted C1 to C8 alkyl group, a substituted or unsubstituted C3 to C8 cycloalkyl group, a substituted or unsubstituted C2 to C8 alkenyl group, a substituted or unsubstituted C2 to C8 alkynyl group, a substituted or unsubstituted C6 to C20 aryl group, or any combination thereof, for example, a methyl group, an ethyl group, a propyl group, a butyl group, an isopropyl group, a tert-butyl group, a 2,2-dimethylpropyl group, a cyclopropyl group, a cyclobutyl group, a cyclopentyl group, a cyclohexyl group, an ethenyl group, a propenyl group, a butenyl group, an ethynyl group, a propynyl group, a butynyl group, a phenyl group, a tolyl group, a xylene group, a benzyl group, or any combination thereof.

$R^2$ and $R^4$ may each independently be, for example, hydrogen, a substituted or unsubstituted C1 to C8 alkyl group, a substituted or unsubstituted C3 to C8 cycloalkyl group, a substituted or unsubstituted C2 to C8 alkenyl group, a substituted or unsubstituted C2 to C8 alkynyl group, a substituted or unsubstituted C6 to C20 aryl group, or a combination thereof, for example, hydrogen, a methyl group, an ethyl group, a propyl group, a butyl group, an isopropyl group, a tert-butyl group, a 2,2-dimethylpropyl group, a cyclopropyl group, a cyclobutyl group, a cyclopentyl group, a cyclohexyl group, an ethenyl group, a propenyl group, a butenyl group, an ethynyl group, a propynyl group, a butynyl group, a phenyl group, a tolyl group, a xylene group, a benzyl group, or any combination thereof.

The compound represented by Chemical Formula 1 may include a compound represented by Chemical Formula 3, a compound represented by Chemical Formula 4, a compound represented by Chemical Formula 5, a compound represented by Chemical Formula 6, or any combination thereof.

[Chemical Formula 3]

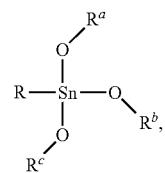

[Chemical Formula 4]

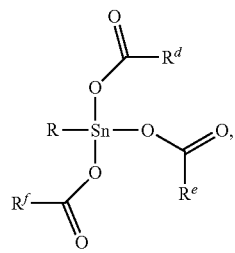

[Chemical Formula 5]

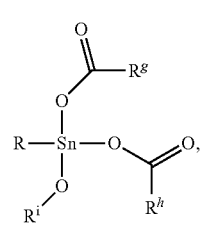

[Chemical Formula 6]

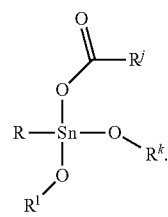

In Chemical Formula 3 to Chemical Formula 6,

R may be the same as defined in Chemical Formula 1, $R^a$, $R^b$, $R^c$, $R^i$, $R^k$, and $R^l$ may independently be the same as defined for $R^1$ in Chemical Formula 1, and $R^d$, $R^e$, $R^f$, $R^g$, $R^h$, and $R^j$ may independently be the same as defined for $R^2$ in Chemical Formula 1.

The semiconductor photoresist composition according to an embodiment of the present disclosure concurrently (e.g., simultaneously) includes the compound represented by Chemical Formula 1 or Chemical Formulae 3 to 6 having three substituents respectively linked via an oxygen atom bound to a tin atom and the compound represented by Chemical Formula 2 having four substituents respectively linked via oxygen atoms bound to a tin atom, and thus provides a photoresist pattern including the organometallic copolymer obtained through copolymerization of the compounds, and this photoresist may have relatively improved etch resistance, sensitivity, and/or resolution as well as excellent pattern-forming capability, and accordingly, patterns formed of the composition may not be destroyed despite having a high aspect ratio.

The organometallic compound represented by Chemical Formula 1 and the organometallic compound represented by Chemical Formula 2 may be included in the semiconductor photoresist composition at a weight ratio of about 20:1 to about 1:1, for example, about 18:1 to about 1:1, about 15:1 to about 1:1, about 12:1 to about 1:1, about 10:1 to about 1:1, about 8:1 to about 1:1, about 5:1 to about 1:1, about 3:1 to about 1:1, or about 2:1 to about 1:1, but are not limited thereto. When the weight ratio of the organometallic compound represented by Chemical Formula 1 and the organometallic compound represented by Chemical Formula 2 satisfies the above-described ranges, a semiconductor photoresist composition having improved sensitivity may be provided.

The semiconductor photoresist composition may include about 0.01 wt % to about 30 wt % of the organometallic compound represented by Chemical Formula 1 and about 0.01 wt % to about 15 wt % of the organometallic compound represented by Chemical Formula 2 based on 100 wt % of the semiconductor photoresist composition. For example, the composition may include about 0.1 wt % to about 20 wt % of the organometallic compound represented by Chemical Formula 1 and about 0.1 wt % to about 10 wt % of the organometallic compound represented by Chemical Formula 2, for example, about 0.1 wt % to about 10 wt % of the organometallic compound represented by Chemical Formula 1 and about 0.1 wt % to about 5 wt % of the organometallic compound represented by Chemical Formula 2, but are not limited thereto.

When the semiconductor photoresist composition according to an embodiment includes the organometallic compound represented by Chemical Formula 1 and the organometallic compound represented by Chemical Formula 2 within the above-described ranges, a coating process when forming a photoresist from the composition may be facilitated and the sensitivity of the photoresist may be improved.

The solvent included in the semiconductor photo resist composition according to an embodiment may be an organic solvent. The solvent may be or include, for example, aromatic compounds (e.g., xylene, toluene, etc.), alcohols (e.g., 4-methyl-2-pentanol, 4-methyl-2-propanol, 1-butanol, methanol, isopropyl alcohol, 1-propanol, etc.), ethers (e.g., anisole, tetrahydrofuran, etc.), esters (n-butyl acetate, propylene glycol monomethyl ether acetate, ethyl acetate, ethyl lactate), ketones (e.g., methyl ethyl ketone, 2-heptanone), or a mixture thereof, but is not limited thereto.

In an embodiment, the semiconductor photo resist composition may further include a resin in addition to the aforementioned organometallic compound and solvent.

The resin may be a phenol-based resin including one or more aromatic moieties selected from Group 1.

[Group 1]

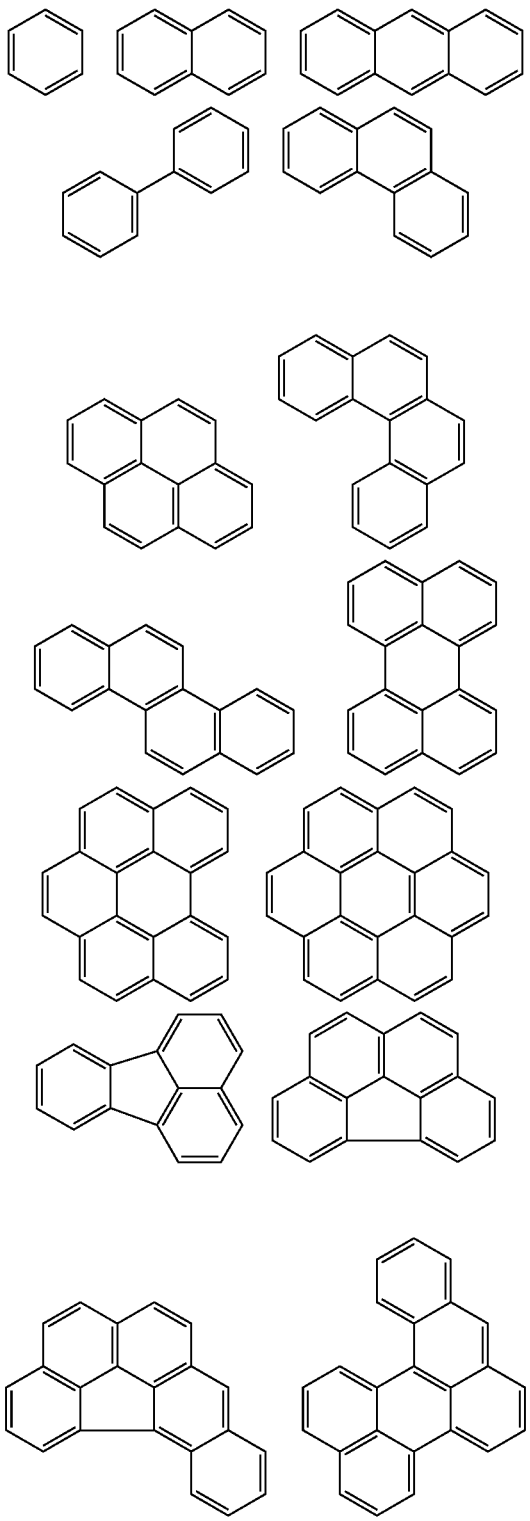

-continued

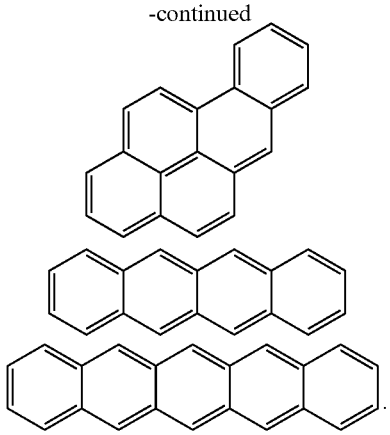

The resin may have a weight average molecular weight of about 500 to about 20,000.

The resin may be included in an amount of about 0.1 wt % to about 50 wt % based on a total amount of the semiconductor resist composition.

When the resin is included within the above-described amount range, the resin may have excellent etch resistance and/or heat resistance.

The semiconductor resist composition according to an embodiment may be desirably composed of the organometallic compound, solvent, and resin. In some embodiments, however, the semiconductor resist composition according to the above embodiment may further include an additive as needed or desired. Non-limiting examples of the additive include a surfactant, a cross-linking agent, a leveling agent, and any combination thereof.

The surfactant may include, for example, an alkyl benzene sulfonate salt, an alkyl pyridinium salt, polyethylene glycol, a quaternary ammonium salt, or any combination thereof, but is not limited thereto.

The cross-linking agent may be, for example, a melamine-based cross-linking agent, a substituted urea-based cross-linking agent, or a polymer-based cross-linking agent, but is not limited thereto. The cross-linking agent may be a cross-linking agent having at least two cross-linking forming substituents, for example, a compound such as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, and/or the like.

The leveling agent may be used for improving coating flatness during printing, and may be a commercially available or suitable known leveling agent.

The amount of each additive may be selected or controlled depending on desired or suitable properties.

In some embodiments, the semiconductor resist composition may further include a silane coupling agent as an adherence enhancer in order to improve a close-contacting force with the substrate (e.g., in order to improve adherence of the semiconductor resist composition to the substrate). The silane coupling agent may be, for example, a silane compound including a carbon-carbon unsaturated bond (such as vinyltrimethoxysilane, vinyltriethoxysilane, vinyl trichlorosilane, or vinyltris(β-methoxyethoxy)silane); 3-methacryloxypropyltrimethoxysilane, 3-acryloxypropyltrimethoxysilane, p-styryl trimethoxysilane, 3-methacryloxypropylmethyldimethoxysilane, 3-methacryloxypropyl-methyl diethoxysilane; trimethoxy[3-(phenylamino)propyl]silane, and/or the like, but is not limited thereto.

The semiconductor photoresist composition may be formed into a pattern having a high aspect ratio without a collapse. Accordingly, in order to form a fine pattern having a width of, for example, about 5 nm to about 100 nm, about 5 nm to about 80 nm, about 5 nm to about 70 nm, about 5 nm to about 50 nm, about 5 nm to about 40 nm, about 5 nm to about 30 nm, or about 5 nm to about 20 nm, the semiconductor resist composition may be used for a photoresist process using light in a wavelength ranging from about 5 nm to about 150 nm, for example, about 5 nm to about 100 nm, about 5 nm to about 80 nm, about 5 nm to about 50 nm, about 5 nm to about 30 nm, or about 5 nm to about 20 nm. Accordingly, the semiconductor photoresist composition according to an embodiment may be used to realize extreme ultraviolet (EUV) lithography using an EUV light source of a wavelength of about 13.5 nm.

One or more example embodiments of the present disclosure provide a method of forming patterns using the semiconductor photoresist composition. For example, the manufactured pattern may be a photoresist pattern.

The method of forming patterns according to an embodiment includes: forming an etching-objective layer on a substrate, coating the semiconductor photo resist composition on the etching-objective layer to form a photoresist layer, patterning the photoresist layer to form a photoresist pattern, and etching the etching-objective layer using the photoresist pattern as an etching mask.

Hereinafter, a method of forming patterns using the semiconductor photo resist composition is described referring to FIGS. 1 to 5. FIGS. 1 to 5 are cross-sectional views for explaining a method of forming patterns using a semiconductor resist composition according to an embodiment.

Referring to FIG. 1, an object for etching is prepared. The object for etching may be a thin layer 102 formed on a semiconductor substrate 100. Hereinafter, the object for etching is limited to the thin layer 102. An entire surface of the thin layer 102 is washed to remove impurities and the like remaining thereon. The thin layer 102 may be for example a silicon nitride layer, a polysilicon layer, or a silicon oxide layer.

Subsequently, the resist underlayer composition for forming a resist underlayer 104 is spin-coated on the surface of the washed thin layer 102. However, the embodiment is not limited thereto, and any suitable coating method (for example, spray coating, dip coating, knife edge coating, etc.) or printing method (for example inkjet printing, screen printing, etc.) and/or the like may be used.

In some embodiments, the coating process of the resist underlayer may be omitted. Hereinafter, a process including a coating of the resist underlayer is described.

The coated composition is dried and baked to form a resist underlayer 104 on the thin layer 102. The baking may be performed at about 100° C. to about 500° C., for example, about 100° C. to about 300° C.

The resist underlayer 104 is formed between the substrate 100 and a photoresist layer 106 and thus may prevent or reduce non-uniformity and improve the pattern-forming capability of a photoresist line width when a ray reflected from the interface between the substrate 100 and the photoresist layer 106 and/or from a hardmask between layers is scattered into an unintended photoresist region.

Referring to FIG. 2, the photoresist layer 106 is formed by coating the semiconductor resist composition on the resist underlayer 104. The photoresist layer 106 is obtained by coating the aforementioned semiconductor resist composition on the thin layer 102 formed on the substrate 100 and then, curing it through a heat treatment.

For example, the formation of a pattern using the semiconductor resist composition may include coating the semiconductor resist composition on the substrate 100 having the thin layer 102 through spin coating, slit coating, inkjet printing, and/or the like, and then drying it to form the photoresist layer 106.

The semiconductor resist composition has already been illustrated in detail and will not be illustrated again.

Subsequently, a substrate 100 having the photoresist layer 106 is subjected to a first baking process. The first baking process may be performed at about 80° C. to about 120° C.

Referring to FIG. 3, the photoresist layer 106 may be selectively exposed through a pattern mask 110.

For example, the exposure may use an activation radiation with light having a high energy wavelength (such as EUV (extreme ultraviolet; a wavelength of about 13.5 nm), an E-Beam (an electron beam), and/or the like), as well as light having a short wavelength (e.g., compared to the visible spectrum) (such as an i-line (a wavelength of about 365 nm), a KrF excimer laser (a wavelength of about 248 nm), an ArF excimer laser (a wavelength of about 193 nm), and/or the like).

In some embodiments, light for the exposure may include a short, high-energy wavelength ranging from about 5 nm to about 150 nm, for example, EUV, an E-Beam, and/or the like.

The exposed region 106b of the photoresist layer 106 has a different solubility from the non-exposed region 106a of the photoresist layer 106 due to forming a polymer by a cross-linking reaction (such as condensation) between organometallic compounds.

Subsequently, the substrate 100 is subjected to a second baking process. The second baking process may be performed at a temperature of about 90° C. to about 200° C. The exposed region 106b of the photoresist layer 106 becomes insoluble in a developing solution due to the second baking process.

In FIG. 4, the non-exposed region 106a of the photoresist layer is dissolved and removed using the developing solution to form a photoresist pattern 108. For example, the non-exposed region 106a of the photoresist layer is dissolved and removed using an organic solvent (such as 2-heptanone and/or the like) to complete the photoresist pattern 108 corresponding to the negative tone image.

As described above, the developing solution used in a method of forming patterns according to an embodiment may be an organic solvent. The organic solvent used in the method of forming patterns according to an embodiment may be or include, for example, ketones (such as methylethylketone, acetone, cyclohexanone, 2-heptanone, and/or the like), alcohols (such as 4-methyl-2-propanol, 1-butanol, isopropanol, 1-propanol, methanol, and/or the like), esters (such as propylene glycol monomethyl ether acetate, ethyl acetate, ethyl lactate, n-butyl acetate, butyrolactone, and/or the like), aromatic compounds (such as benzene, xylene, toluene, and/or the like), or a combination thereof.

However, the photoresist pattern according to an embodiment is not necessarily limited to being a negative tone image, and for example, may be formed to have a positive tone image. Herein, a developing agent used for forming the positive tone image may be a quaternary ammonium hydroxide composition (such as tetraethylammonium hydroxide, tetrapropylammonium hydroxide, tetrabutylammonium hydroxide, or any combination thereof).

As described above, exposure to high energy light (such as EUV, an E-Beam, and/or the like), as well as light having a second wavelength (such as i-line (wavelength of about 365 nm), KrF excimer laser (wavelength of about 248 nm), ArF excimer laser (wavelength of about 193 nm), and/or the like) may provide a photoresist pattern 108 having a width of about 5 nm to about 100 nm. For example, the photoresist pattern 108 may have a width of about 5 nm to about 90 nm, about 5 nm to about 80 nm, about 5 nm to about 70 nm, about 5 nm to about 60 nm, about 10 nm to about 50 nm, about 10 nm to about 40 nm, about 10 nm to about 30 nm, or about 10 nm to about 20 nm.

In some embodiments, the photoresist pattern 108 may have a half-pitch of less than or equal to about 50 nm, for example, less than or equal to about 40 nm, less than or equal to about 30 nm, or less than or equal to about 25 nm, and a line width roughness of less than or equal to about 10 nm, or less than or equal to about 5 nm.

Subsequently, the photoresist pattern 108 is used as an etching mask to etch the resist underlayer 104. Through this etching process, an organic layer pattern 112 is formed. The organic layer pattern 112 may have a width corresponding to that of the photoresist pattern 108.

Referring to FIG. 5, the photoresist pattern 108 is applied as an etching mask to etch the exposed thin layer 102. As a result, the thin layer is formed with a thin layer pattern 114.

The etching of the thin layer 102 may be, for example, a dry etching using an etching gas, and the etching gas may be, for example, $CHF_3$, $CF_4$, $Cl_2$, $BCl_3$, or any mixture thereof.

In the exposure process, the thin layer pattern 114 formed by using the photoresist pattern 108 formed through the exposure process using an EUV light source may have a width corresponding to that of the photoresist pattern 108. For example, the thin layer pattern 114 may have a width of about 5 nm to about 100 nm, which is equal to that of the photoresist pattern 108. For example, the thin layer pattern 114 formed by using the photoresist pattern 108 formed through the exposure process using an EUV light source may have a width of about 5 nm to about 90 nm, about 5 nm to about 80 nm, about 5 nm to about 70 nm, about 5 nm to about 60 nm, about 10 nm to about 50 nm, about 10 nm to about 40 nm, about 10 nm to about 30 nm, and about 10 nm to about 20 nm, or less than or equal to about 20 nm, like that of the photoresist pattern 108.

Hereinafter, the present disclosure is described in more detail through Examples regarding preparation of the aforementioned semiconductor photoresist composition. However, the present disclosure is not restricted by the following Examples.

EXAMPLES

Synthesis Example 1

20 g (51.9 mmol) of $Ph_3SnCl$ was dissolved in 70 mL of THF in a 250 mL 2-necked and round-bottomed flask, and then cooled down to 0° C. in an ice bath. Subsequently, a 1 M butyl magnesium chloride (BuMgCl) THF solution (62.3 mmol) was slowly added thereto in a dropwise fashion. When the dropwise addition was complete, the obtained mixture was stirred at room temperature for 12 hours to obtain a compound represented by Chemical Formula 7 at a yield of 85%.

[Chemical Formula 7]

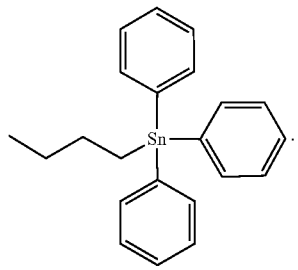

Synthesis Example 2

A compound represented by Chemical Formula 8 was obtained at a yield of 88% using substantially the same method as Synthesis Example 1, except that a 2 M isopropyl magnesium chloride (iPrMgCl) THF solution (62.3 mmol) was used instead of the 1 M butyl magnesium chloride (BuMgCl) THF solution in Synthesis Example 1.

[Chemical Formula 8]

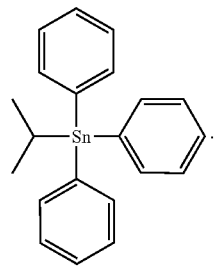

Synthesis Example 3

A compound represented by Chemical Formula 9 was obtained at a yield of 76% using substantially the same method as Synthesis Example 1, except that a 1 M neopentyl magnesium chloride THF solution (62.3 mmol) was used instead of the 1 M butyl magnesium chloride (BuMgCl) THF solution in Synthesis Example 1.

[Chemical Formula 9]

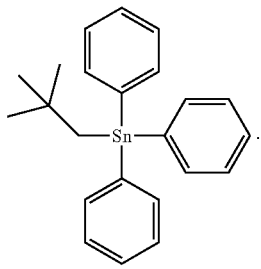

Synthesis Example 4

The compound represented by Chemical Formula 7 according to Synthesis Example 1 (10 g, 24.6 mmol) was dissolved in 50 mL of $CH_2Cl_2$, and 3 equivalents (73.7 mmol) of a 2 M HCl diethyl ether solution was slowly added thereto in a dropwise fashion at −78° C. for 30 minutes. Subsequently, the obtained mixture was stirred at room temperature for 12 hours, and a compound represented by Chemical Formula 10 was obtained at a yield of 80% by concentrating the solvent and performing vacuum distillation.

[Chemical Formula 10]

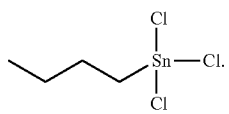

Synthesis Example 5

A compound represented by Chemical Formula 11 was obtained at a yield of 75% according to substantially the same method as Synthesis Example 4, except that the compound represented by Chemical Formula 8 according to Synthesis Example 2 was used instead of the compound represented by Chemical Formula 7 according to Synthesis Example 1.

[Chemical Formula 11]

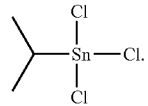

Synthesis Example 6

A compound represented by Chemical Formula 12 was obtained at a yield of 70% according to substantially the same method as Synthesis Example 4, except that the compound represented by Chemical Formula 9 according to Synthesis Example 3 was used instead of the compound represented by Chemical Formula 7 according to Synthesis Example 1.

[Chemical Formula 12]

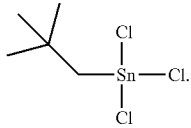

Synthesis Example 7

25 mL of acetic acid was slowly added in a dropwise fashion to 10 g (25.6 mmol) of the compound represented by Chemical Formula 10 according to Synthesis Example 4 at room temperature, and then heated and refluxed for 12 hours. The temperature was decreased to room temperature, and then the acetic acid was vacuum distilled to obtain a compound represented by Chemical Formula 13 at a yield of 90%.

[Chemical Formula 13]

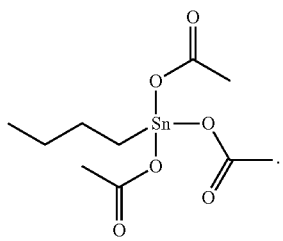

Synthesis Example 8

25 mL of acrylic acid was slowly added in a dropwise fashion to 10 g (25.4 mmol) of the compound represented by Chemical Formula 11 according to Synthesis Example 5 at room temperature, and then heated and refluxed at 80° C. for 6 hours. The temperature was decreased to room temperature, and then, the acrylic acid was vacuum distilled to obtain a compound represented by Chemical Formula 14 at a yield of 50%.

[Chemical Formula 14]

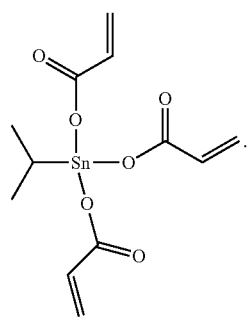

Synthesis Example 9

25 mL of propionic acid was slowly added in a dropwise fashion to 10 g (23.7 mmol) of the compound represented by Chemical Formula 12 according to Synthesis Example 6 at room temperature, and then heated and refluxed at 110° C. for 12 hours. The temperature was decreased to room temperature, and then the propionic acid was vacuum distilled to obtain a compound represented by Chemical Formula 15 at a yield of 40%.

[Chemical Formula 15]

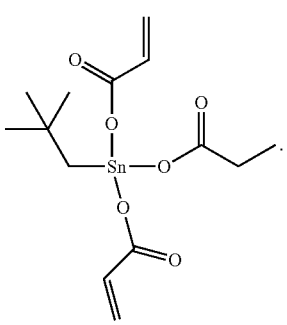

Synthesis Example 10

30 mL of anhydrous pentane was added to 10 g (35.4 mmol) of the compound represented by Chemical Formula 10 according to Synthesis Example 4, and then cooled down to 0° C. 7.8 g (106.3 mmol) of diethylamine was slowly added thereto in a dropwise fashion, and subsequently 7.9 g (106.3 mmol) of tert-butanol was added thereto and then stirred at room temperature for 1 hour. When the reaction was complete, the resultant was filtered, concentrated, and vacuum-dried to obtain a compound represented by Chemical Formula 16 at a yield of 60%.

[Chemical Formula 16]

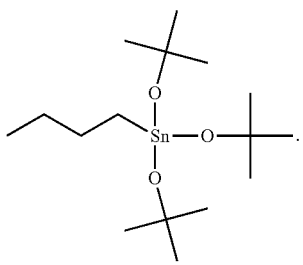

Synthesis Example 11

30 mL of anhydrous pentane was added to 10 g (37.3 mmol) of the compound represented by Chemical Formula 11 according to Synthesis Example 5, and then cooled down to 0° C. 8.2 g (111.9 mmol) of diethylamine was slowly added thereto in a dropwise fashion, and subsequently, 6.7 g (111.9 mmol) of isopropanol was added thereto and then stirred at room temperature for 1 hour. When the reaction was complete, the resultant was filtered, concentrated, and vacuum-dried to obtain a compound represented by Chemical Formula 17 at a yield of 60%.

[Chemical Formula 17]

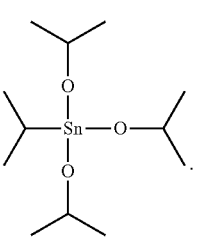

Synthesis Example 12

30 mL of anhydrous pentane was added to 10 g (18.7 mmol) of the compound represented by Chemical Formula 12 according to Synthesis Example 6, and then cooled down to 0° C. 7.4 g (101.3 mmol) of diethylamine was slowly added thereto in a dropwise fashion, and subsequently, 6.1 g (101.3 mmol) of ethanol was added thereto and then stirred at room temperature for 1 hour. When the reaction was complete, the resultant was filtered, concentrated, and vacuum-dried to obtain a compound represented by Chemical Formula 18 at a yield of 60%.

[Chemical Formula 18]

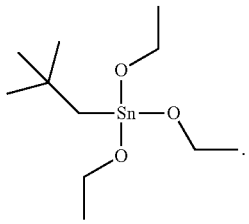

Synthesis Example 13

10 g (25.4 mmol) of the compound represented by Chemical Formula 8 was put in a 100 mL round-bottomed flask, and 25 mL of formic acid was slowly added thereto in a dropwise fashion at room temperature, and then heated and refluxed at 100° C. for 24 hours.

Subsequently, the temperature was decreased to room temperature, and then, the formic acid was vacuum distilled to obtain a compound represented by Chemical Formula 19 at a yield of 90%.

[Chemical Formula 19]

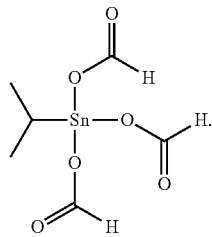

Synthesis Example 14

$Ph_4Sn$ (20 g, 46.8 mmol) was put in a 100 mL round-bottomed flask, and 50 mL of propionic acid was slowly added thereto in a dropwise fashion and the, heated and refluxed at 110° C. for 26 hours. Subsequently, the temperature was decreased to room temperature, and the propionic acid was vacuum-distilled to obtain a compound represented by Chemical Formula 20 at a yield of 95%.

[Chemical Formula 20]

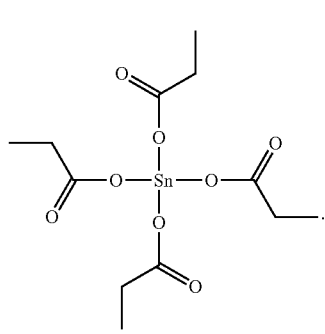

Synthesis Example 15

154 mL of an 1 M sodium ethoxide ethanol solution was put in a 100 mL round-bottomed flask, and 10 g (38.4 mmol) of $SnCl_4$ was slowly added thereto in a dropwise fashion at 0° C. The temperature was increased to room temperature, and then the obtained mixture was stirred for 12 hours and vacuum-distilled to obtain a compound represented by Chemical Formula 21 at a yield of 70%.

[Chemical Formula 21]

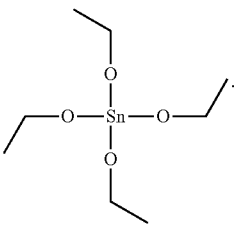

Examples 1 to 14

Compounds 13 to 19 according to Synthesis Examples 7 to 13 were respectively dissolved in xylene at a concentration of 2 wt %, and Compounds 20 and 21 according to Synthesis Examples 14 and 15 were respectively dissolved at a concentration of 0.2 wt % in portions of each of the xylene solutions including, Compounds 13 to 19, and the solutions were filtered with a 0.1 μm PTFE (polytetrafluoroethylene) syringe filter to prepare semiconductor photoresist compositions according to Examples 1 to 14. Specific compound combinations of the semiconductor photoresist compositions are shown in Table 1.

A 4-inch diameter disk-shaped silicon wafer having a native-oxide surface was used as a substrate for thin film coating, and treated in a UV ozone cleaning system for 10 minutes before coating the compositions. On the treated substrate, the semiconductor photoresist compositions according to Examples 1 to 14 were respectively spin-coated at 1500 rpm for 30 seconds and then, baked (baked after applied, PAB (post-apply bake)) at 100° C. for 120 seconds to form a photoresist thin film.

After the coating and baking, the thicknesses of the films were measured through ellipsometry to be about 25 nm.

Comparative Example 1

A semiconductor photoresist composition according to Comparative Example 1 and a photoresist thin film including the same were manufactured according to substantially the same method as in the Examples, except that the compound represented by Chemical Formula 13 according to Synthesis Example 7 was dissolved at a concentration of 2 wt % in xylene. After coating and baking, the thickness of the film was about 25 nm.

Comparative Example 2

A semiconductor photoresist composition according to Comparative Example 2 and a photoresist thin film including the same were manufactured according to substantially the same method as in Example 1, except that nBuSnOOH (TCI Inc.) was used instead of the compound represented by Chemical Formula 13. After coating and baking, the thickness of the film was about 25 nm.

TABLE 1

| | Organometallic compound (A) | Organometallic compound (B) |
|---|---|---|
| Example 1 | Chemical Formula 13 | Chemical Formula 20 |
| Example 2 | Chemical Formula 14 | Chemical Formula 20 |
| Example 3 | Chemical Formula 15 | Chemical Formula 20 |
| Example 4 | Chemical Formula 16 | Chemical Formula 20 |
| Example 5 | Chemical Formula 17 | Chemical Formula 20 |
| Example 6 | Chemical Formula 18 | Chemical Formula 20 |
| Example 7 | Chemical Formula 19 | Chemical Formula 20 |
| Example 8 | Chemical Formula 13 | Chemical Formula 21 |
| Example 9 | Chemical Formula 14 | Chemical Formula 21 |
| Example 10 | Chemical Formula 15 | Chemical Formula 21 |
| Example 11 | Chemical Formula 16 | Chemical Formula 21 |
| Example 12 | Chemical Formula 17 | Chemical Formula 21 |
| Example 13 | Chemical Formula 18 | Chemical Formula 21 |
| Example 14 | Chemical Formula 19 | Chemical Formula 21 |
| Comparative Example 1 | Chemical Formula 13 | — |
| Comparative Example 2 | nBuSnOOH (TCI Inc.) | Chemical Formula 20 |

Evaluation

The films according to Examples 1 to 14 and Comparative Examples 1 to 2 formed on a disk-shaped silicon wafer in the coating method were exposed to extreme ultraviolet (EUV) to form 12 nm to 100 nm line/space patterns by varying energy and a focus. After the exposure, the films were baked at 180° C. for 120 seconds, dipped in a Petri dish containing 2-heptanone for 60 seconds and taken out, and washed with the same solvent for 10 seconds. Finally, the films were baked at 150° C. for 5 minutes, and then, pattern images thereof were obtained through SEM (scanning electron microscopy). From the SEM images, the highest resolution, optimal energy, and line edge roughness (LER) are provided Table 2.

TABLE 2

| | Resolution (nm) | Energy (mJ/cm$^2$) | LER (nm) |
|---|---|---|---|
| Example 1 | 15.0 | 53 | 2.5 |
| Example 2 | 16.0 | 35 | 2.9 |
| Example 3 | 15.1 | 48 | 2.5 |
| Example 4 | 14.5 | 50 | 3.0 |
| Example 5 | 15.6 | 48 | 3.0 |
| Example 6 | 15.0 | 42 | 3.3 |
| Example 7 | 15.6 | 35 | 3.0 |
| Example 8 | 15.3 | 55 | 2.5 |
| Example 9 | 15.8 | 35 | 3.0 |
| Example 10 | 14.8 | 44 | 3.2 |
| Example 11 | 15.5 | 52 | 2.5 |
| Example 12 | 15.0 | 44 | 2.9 |
| Example 13 | 14.3 | 37 | 3.6 |
| Example 14 | 15.2 | 35 | 3.2 |
| Comparative Example 1 | 18.5 | 75 | 4.6 |
| Comparative Example 2 | 19.1 | 96 | 4.5 |

Referring to Table 2, the photoresist thin films formed by using a semiconductor photoresist composition concurrently (e.g., simultaneously) including one of the compounds represented by Chemical Formulae 13 to 19 according to Examples 1 to 14 and the compound represented by Chemical Formula 20 or 21 exhibited excellent resolution, sensitivity, and line edge roughness (LER).

In contrast, the photoresist thin films formed of the semiconductor photoresist composition of Comparative Example 1 including the compound represented by Chemical Formula 13 alone and the semiconductor photoresist composition of Comparative Example 2 including nBuSnOOH (TCI Inc.) and the compound represented by Chemical Formula 20 both exhibited higher (e.g., more unfavorable) resolution, optimal energy, and line edge roughness (LER) compared with those of Examples.

Hereinbefore, certain example embodiments of the present disclosure have been described and illustrated, however, it should be apparent to those having ordinary skill in the art that the present disclosure is not limited to the example embodiment as described, and may be variously modified and transformed without departing from the spirit and scope of the present disclosure. Accordingly, the modified or transformed example embodiments as such may not be understood separately from the technical ideas and aspects of the present disclosure, and the modified example embodiments are within the scope of the claims of the present disclosure and equivalents thereof.

100: substrate
102: thin layer
104: photoresist underlayer
106: photoresist layer
106b: exposed region
106a: non-exposed region
108: photoresist pattern
112: organic layer pattern
114: thin film pattern

What is claimed is:

1. A semiconductor photoresist composition, comprising:
an organometallic compound represented by Chemical Formula 1,
an organometallic compound represented by Chemical Formula 2, and
a solvent:

[Chemical Formula 1]

wherein, in Chemical Formula 1,
R is a substituted or unsubstituted C1 to C20 alkyl group, a substituted or unsubstituted C3 to C20 cycloalkyl group, a substituted or unsubstituted C2 to C20 aliphatic unsaturated organic group comprising at least one double bond or triple bond, a substituted or unsubstituted C6 to C30 aryl group, an ethylene oxide group, a propylene oxide group, or any combination thereof,
X, Y, and Z are each independently —OR$^1$ or —OC(=O)R$^2$,
R$^1$ is a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or any combination thereof, and
R$^2$ is hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or any combination thereof;

[Chemical Formula 2]

wherein, in Chemical Formula 2,

X' is —OR$^3$ or —OC(=O)R$^4$,

R$^3$ is a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or any combination thereof, and R$^4$ is hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or any combination thereof, and wherein the organometallic compound represented by Chemical Formula 1 and the organometallic compound represented by Chemical Formula 2 are included in a weight ratio of about 20:1 to about 1:1.

2. The semiconductor photoresist composition of claim 1, wherein:

R is a substituted or unsubstituted C1 to C8 alkyl group, a substituted or unsubstituted C3 to C8 cycloalkyl group, a substituted or unsubstituted C2 to C8 aliphatic unsaturated organic group comprising at least one double bond or triple bond, a substituted or unsubstituted C6 to C20 aryl group, an ethylene oxide group, a propylene oxide group, or any combination thereof, R$^1$ and R$^3$ are each independently a substituted or unsubstituted C1 to C8 alkyl group, a substituted or unsubstituted C3 to C8 cycloalkyl group, a substituted or unsubstituted C2 to C8 alkenyl group, a substituted or unsubstituted C2 to C8 alkynyl group, a substituted or unsubstituted C6 to C20 aryl group, or any combination thereof, and R$^2$ and R$^4$ are each independently hydrogen, a substituted or unsubstituted C1 to C8 alkyl group, a substituted or unsubstituted C3 to C8 cycloalkyl group, a substituted or unsubstituted C2 to C8 alkenyl group, a substituted or unsubstituted C2 to C8 alkynyl group, a substituted or unsubstituted C6 to C20 aryl group, or any combination thereof.

3. The semiconductor photoresist composition of claim 1, wherein:

R is a methyl group, an ethyl group, a propyl group, a butyl group, an isopropyl group, a tert-butyl group, a 2,2-dimethylpropyl group, a cyclopropyl group, a cyclobutyl group, a cyclopentyl group, a cyclohexyl group, an ethenyl group, a propenyl group, a butenyl group, an ethynyl group, a propynyl group, a butynyl group, a phenyl group, a tolyl group, a xylene group, a benzyl group, an ethylene oxide group, a propylene oxide group, or any combination thereof, R$^1$ and R$^3$ are each independently a methyl group, an ethyl group, a propyl group, a butyl group, an isopropyl group, a tert-butyl group, a 2,2-dimethylpropyl group, a cyclopropyl group, a cyclobutyl group, a cyclopentyl group, a cyclohexyl group, an ethenyl group, a propenyl group, a butenyl group, an ethynyl group, a propynyl group, a butynyl group, a phenyl group, a tolyl group, a xylene group, a benzyl group, or any combination thereof, and R$^2$ and R$^4$ are each independently hydrogen, a methyl group, an ethyl group, a propyl group, a butyl group, an isopropyl group, a tert-butyl group, a 2,2-dimethylpropyl group, a cyclopropyl group, a cyclobutyl group, a cyclopentyl group, a cyclohexyl group, an ethenyl group, a propenyl group, a butenyl group, an ethynyl group, a propynyl group, a butynyl group, a phenyl group, a tolyl group, a xylene group, a benzyl group, or any combination thereof.

4. The semiconductor photoresist composition of claim 1, wherein the compound represented by Chemical Formula 1 comprises a compound represented by Chemical Formula 3, a compound represented by Chemical Formula 4, a compound represented by Chemical Formula 5, a compound represented by Chemical Formula 6, or any combination thereof:

[Chemical Formula 3]

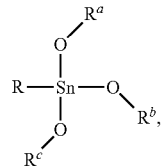

[Chemical Formula 4]

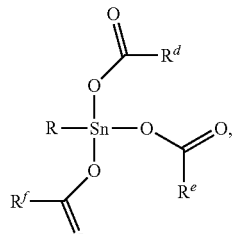

[Chemical Formula 5]

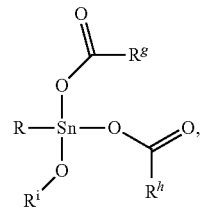

[Chemical Formula 6]

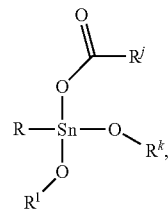

wherein, in Chemical Formula 3, Chemical Formula 4, Chemical Formula 5, and Chemical Formula 6, R is a substituted or unsubstituted C1 to C20 alkyl group, a substituted or unsubstituted C3 to C20 cycloalkyl group, a substituted or unsubstituted C2 to C20 aliphatic unsaturated organic group comprising at least one double bond or triple bond, a substituted or unsubstituted C6 to C30 aryl group, an ethylene oxide group, a propylene oxide group, or any combination thereof, R$^a$, R$^b$, R$^c$, R$^i$, R$^k$, and R$^l$ are each independently a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or any combination thereof, and R$^d$, R$^e$, R$^f$, R$^g$, R$^h$, and R$^j$ are each independently hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or any combination thereof.

5. The semiconductor photoresist composition of claim 1, wherein the composition comprises about 0.01 wt % to about 30 wt % of the organometallic compound represented by Chemical Formula 1 and about 0.01 wt % to about 15 wt % of the organometallic compound represented by Chemical Formula 2, based on 100 wt % of the semiconductor photoresist composition.

6. The semiconductor photoresist composition of claim 1, wherein the composition comprises an additive selected from a surfactant, a cross-linking agent, a leveling agent, and combinations thereof.

7. A method of forming patterns, the method comprising:
forming an etching-objective layer on a substrate;
coating the semiconductor resist composition of claim 1 on the etching-objective layer to form a photoresist layer;
patterning the photoresist layer to form a photoresist pattern; and
etching the etching-objective layer using the photoresist pattern as an etching mask.

8. The method of claim 7, wherein the photoresist pattern is formed utilizing light having a wavelength of about 5 nm to about 150 nm.

9. The method of claim 7, further comprising:
providing a resist underlayer formed between the substrate and the photoresist layer.

10. The method of claim 7, wherein the photoresist pattern has a width of about 5 nm to about 100 nm.

* * * * *